United States Patent
Dorst

(10) Patent No.: US 7,353,327 B1
(45) Date of Patent: *Apr. 1, 2008

(54) DEDICATED COMMAND PORT FOR MEMORY CONTROLLERS

(75) Inventor: Jeffrey R. Dorst, Austin, TX (US)

(73) Assignee: ZiLOG, Inc., San Jose, CA (US)

( * ) Notice: Subject to any disclaimer, the term of this patent is extended or adjusted under 35 U.S.C. 154(b) by 340 days.

This patent is subject to a terminal disclaimer.

(21) Appl. No.: 11/146,246

(22) Filed: Jun. 3, 2005

Related U.S. Application Data

(63) Continuation of application No. 09/971,196, filed on Oct. 4, 2001, now Pat. No. 6,941,416.

(51) Int. Cl.
G06F 12/00 (2006.01)
G06F 13/00 (2006.01)

(52) U.S. Cl. .................. 711/104; 711/149; 711/154
(58) Field of Classification Search .............. 711/5, 711/100, 105, 106, 154, 149
See application file for complete search history.

(56) References Cited

U.S. PATENT DOCUMENTS

| | | | |
|---|---|---|---|
| 5,535,169 A | 7/1996 | Endo et al. | 365/230.03 |
| 5,706,407 A | 1/1998 | Nakamura et al. | 395/86 |
| 5,796,669 A | 8/1998 | Araki et al. | 365/222 |
| 5,809,340 A | 9/1998 | Bertone et al. | 395/878 |
| 5,974,501 A | 10/1999 | Shaver et al. | 711/105 |
| 6,047,361 A * | 4/2000 | Ingenio et al. | 711/167 |
| 6,061,292 A | 5/2000 | Su et al. | 365/230.06 |
| 6,260,127 B1 | 7/2001 | Olarig et al. | 711/167 |
| 6,366,989 B1 | 4/2002 | Keskar et al. | 711/167 |
| 6,438,670 B1 | 8/2002 | McClannahan | 711/167 |
| 6,779,125 B1 | 8/2004 | Haban | 713/500 |
| 6,968,419 B1 * | 11/2005 | Holman | 711/5 |
| 7,073,014 B1 * | 7/2006 | Roohparvar | 711/103 |
| 2002/0002662 A1 | 1/2002 | Olarig et al. | 711/167 |
| 2002/0007436 A1 | 1/2002 | Yoshida | 711/105 |
| 2002/0013881 A1 | 1/2002 | Delp et al. | 711/105 |
| 2003/0105933 A1 | 6/2003 | Keskar et al. | 711/167 |

OTHER PUBLICATIONS

Motorola, PowerPC, "MPC 860 Power QUICC™ User's Manual," Rev. 1, Jul. 1998.
Motorola, PowerPC, "MPC 8240 Integrated Processor User's Manual," Rev. 0, Jul. 1999.
Micron Semiconductor Products, Inc., "Synchronous DRAM" data sheet, Nov. 1999.
Motorola, PowerPC, "MPC 8260 Power QUICCII™ User's Manual," Rev. 0, Apr. 1999.

* cited by examiner

*Primary Examiner*—Tuan V. Thai
(74) *Attorney, Agent, or Firm*—Imperium Patent Works; Darien K. Wallace; T. Lester Wallace

(57) ABSTRACT

A memory controller includes a chip-select-interface controller and a synchronous random-access-memory (SDRAM)-interface controller. The chip-select-interface controller communicates with a chip-select-interface type of memory. The SDRAM-interface controller is configured to communicate with one or more SDRAMs. The SDRAM-interface controller provides a plurality of interface signals to the SDRAM via a dedicated port. One of the interface signals, an SDRAM address/control signal, has a dual role. In one role, it serves as an address bit during memory transactions with the SDRAM. In a second role, it serves as a control signal that facilitates the refresh operation of the SDRAM.

14 Claims, 7 Drawing Sheets

DEDICATED COMMAND PORT FOR MEMORY CONTROLLERS

CROSS REFERENCE TO RELATED APPLICATION

This application is a continuation of, and claims priority under 35 U.S.C. § 120 from, nonprovisional U.S. patent application Ser. No. 09/971,196 entitled "Apparatus and Methods For Dedicated Command Port in Memory Controllers," filed on Oct. 4, 2001, now U.S. Pat. No. 6,941,416 the subject matter of which is incorporated herein by reference. Application Ser. No. 09/971,196 was filed concurrently with commonly owned U.S. patent application Ser. No. 09/971,197 entitled "Apparatus and Methods For Programmable Interfaces in Memory Controllers," filed on Oct. 4, 2001, now abandoned, the subject matter of which is incorporated herein by reference.

TECHNICAL FIELD

The present invention relates to data processing systems, and more specifically to apparatus and methods for dedicated ports in memory controllers

BACKGROUND

Present-day data-processing applications perform increasingly complex operations on progressively larger amounts of data. Handling the large amount of data has resulted in memory circuits with increased sophistication and capacity. To reduce the burden and overhead on the processor or processors of interfacing with and controlling the memory, data-processing systems typically include one or more memory controllers.

To address various data storage and retrieval needs, data-processing systems usually include more than one type of memory. Some of the memories use a random-access-memory (RAM) interface to accommodate memory circuits such as dynamic random-access memories (DRAM). Other memories incorporate a chip-select interface (CSI) or chip-enable interface, a typically asynchronous interface that includes address signals, read and/or write enable signals, and a chip-select or chip-enable signal.

Each of those types of memory typically has its own operational specifications which, among other things, include timing and stimulus signal sequences and specifications. Controlling those memory circuits typically entails providing timing and control signals that meet each manufacturer's and each particular part's specifications. To lower costs and reduce physical form factors, RAM devices and CSI devices usually share signal connections and package pins, such as address and data buses.

The sharing of address and data buses usually works well, but refresh operations for synchronous DRAM (SDRAM) devices pose a complication. In a system that includes SDRAM devices, the SDRAM controller (part of the functionality of a memory controller that typically includes a CSI controller) performs refresh operations periodically to avoid dissipation of the charges that represents the data stored within the SDRAM devices. If the system also includes CSI devices, the SDRAM and CSI devices may share address and data buses. In some systems, the SDRAM devices use an interface that includes control signals separate from the CSI devices' control signals. Thus, the refresh operation of the SDRAM devices may proceed without conflict with any transactions with the CSI devices.

In systems that include SDRAM controllers with paging capability, however, the SDRAM controller and the CSI controller may conflict with each other's use of the shared address bus. SDRAM controllers that support paging typically use the same set of control signals that systems without paging use. In addition to those control signals, however, SDRAM controllers that support paging also use an additional signal to ensure proper refresh operations. Memory controllers with paging support commonly use bit 10 of the shared address bus to facilitate closing any open pages before a refresh operation or command issues.

Under normal operating conditions in those systems, the SDRAM controller performs refresh operations at regular intervals. When the time to perform a refresh operation arrives, if the CSI controller is not using the shared address bus, the SDRAM controller may use the shared address bus (e.g., address bit 10) to close any open pages in order to perform refresh operations. If, however, the CSI controller is using the shared address bus and, in particular, address bit 10, the SDRAM controller has to wait until the CSI controller relinquishes the shared address bus.

Conventional systems use techniques such as refresh queues to address and resolve the conflict between the CSI controller's use of the shared address bus and the SDRAM controller's need to use the shared address bus to facilitate refresh operations. Under those circumstances, the SDRAM controller postpones SDRAM refresh operations until the CSI controller relinquishes the shared address bus. The conflict between the CSI controller and the SDRAM controller, however, causes inefficiency and decreased throughput. Moreover, in extreme cases where the CSI controller interfacing with a slow CSI device fails to relinquish the shared address bus for a relatively long time, the SDRAM controller may fail to perform a refresh operation in time to avert loss of data and, possibly, system failure. A need therefore exists for memory controllers that support paging and yet provide a way of performing timely refresh of the SDRAM devices.

SUMMARY

This disclosure involves apparatus and methods for communicating with, or controlling, memory circuits. Memory controllers according to the invention overcome the conflicts between controllers for CSI-type devices and SDRAM-type devices in conventional memory controllers.

One aspect of the invention concerns apparatus for controlling memories. In one embodiment, a memory controller according to the invention includes a chip-select-interface controller that communicates with at least one chip-select-interface memory. The memory controller also includes an SDRAM-interface controller that communicates with at least one SDRAM. The SDRAM-interface controller provides a plurality of interface signals to the at least one SDRAM via a dedicated port.

In a second embodiment, a memory controller according to the invention includes a chip-select-interface controller, an SDRAM-interface controller, and an interface circuitry. The chip-select-interface controller controls chip-select-interface memories. The SDRAM-interface controller controls SDRAMs. The interface circuitry couples the chip-select-interface controller to at least one chip-select-interface memory via a bus. Furthermore, the interface circuitry couples the SDRAM-interface controller to at least one SDRAM via the bus. The interface circuitry communicates an SDRAM address/control signal to the at least one SDRAM.

In a third embodiment, a data-processing system includes a processor, at least one SDRAM, and a memory controller. The processor receives, decodes, and executes instructions. The at least one SDRAM stores and retrieves data. The memory controller couples to the processor and to the at least one SDRAM. The memory controller communicates with the at least one SDRAM via a dedicated command port. The dedicated command port communicates a plurality of interface signals to the at least one SDRAM. The plurality of interface signals includes an SDRAM address/control signal.

Another aspect of the invention relates to methods of communicating with memory circuits or controlling memory circuits. In one embodiment, a method according to the invention of communicating with memory circuits includes communicating with at least one chip-select interface memory via a chip-select-interface controller; and communicating with at least one SDRAM via an SDRAM-interface controller. The SDRAM-interface controller provides a plurality of interface signals to the at least one SDRAM via a dedicated port.

In another embodiment, a method according to the invention of controlling memory circuits includes providing a chip-select-interface controller to control chip-select-interface memories, and providing an SDRAM-interface controller to control SDRAMs. The method further includes using the chip-select-interface controller to communicate with at least one chip-select-interface memory via an interface circuitry coupled to a bus; using the SDRAM-interface controller to communicate with at least one SDRAM via the interface circuitry and the bus; and communicating an SDRAM address/control signal to the at least one SDRAM via the interface circuitry.

Other embodiments and advantages are described in the detailed description below. This summary does not purport to define the invention. The invention is defined by the claims.

BRIEF DESCRIPTION OF THE DRAWINGS

The appended drawings illustrate only exemplary embodiments of the invention and should not be construed to limit its scope. The disclosed inventive concepts lend themselves to other equally effective embodiments. In the drawings, the same numerals used in more than one drawing denote the same, similar, or equivalent functionality, components, or blocks.

DETAILED DESCRIPTION

Reference will now be made in detail to some embodiments of the invention, examples of which are illustrated in the accompanying drawings.

This invention contemplates apparatus and methods for dedicated command ports in memory controllers. More particularly, the invention relates to dedicated command ports for SDRAM type of memories. Memory controllers according to the invention provide a solution to the problems encountered in conventional memory controllers. Specifically, memory controllers according to the invention use a dedicated SDRAM-device address/control signal line that overcomes the conflict between SDRAM devices and CSI devices in conventional memory controllers.

Figure 1:
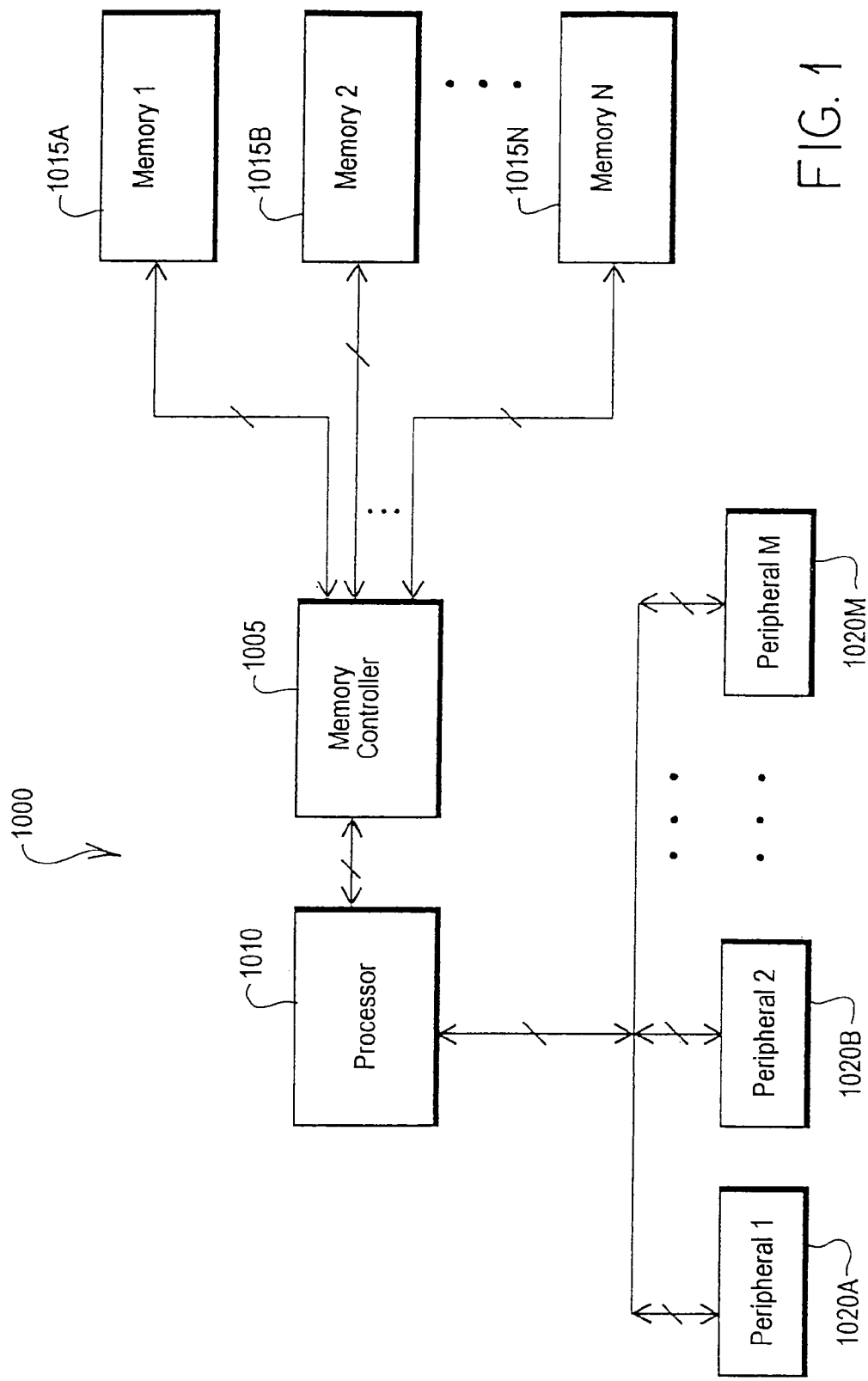
FIG. 1 shows a conceptual block diagram of a data-processing system that includes a memory controller according to the invention.

FIG. 1 shows a conceptual block diagram of a data-processing system 1000 that includes a memory controller 1005 according to the invention. The data-processing system 1000 also includes a processor 1010. Depending on its specifications and particular implementation, the system 1000 may have more than one processor 1010 and/or more than one memory controller 1005, as desired. The processor 1010 receives, decodes, and executes program instructions. The program instructions may operate on data within the system 1000 and/or external data.

One or more memories 1015A-1015N store program instructions and data. Generally, the memories 1015A-1015N may include a wide variety of memories, such as read-only memories (ROM), random-access memories (RAM), static random-access memories (SRAM), dynamic random-access memories (DRAM), synchronous dynamic random-access memories (SDRAM), flash memories, programmable read-only memories (PROM), erasable programmable read-only memories (EPROM), electrically erasable read-only memories (EEROM), and electrically erasable programmable read-only memories (EEPROM). The memory controller 1005 couples to, and communicates with, the memories 1015A-1015N. The memory controller 1005 may also communicate with the processor 1010, either directly, or through an interface circuitry (not shown).

The system 1000 may optionally include one or more peripherals 1020A-1020M, as desired. The peripherals 1020A-1020M may include a variety of devices, for example, communication or telecommunication circuitry, video circuitry, audio circuitry, input circuitry, output circuitry, storage circuitry, and network circuitry. The system 1000 may also include one or more interface circuitries (not shown explicitly) that interface one or more of the peripherals 1020A-1020M to the processor 1010. Note that at least some of the peripherals 1020A-1020M and/or interface circuitries (not shown) may reside within the processor 1010, as desired. Note also that one may integrate one or more blocks of the system 1000 in one or more integrated circuits, as desired.

Figure 2:
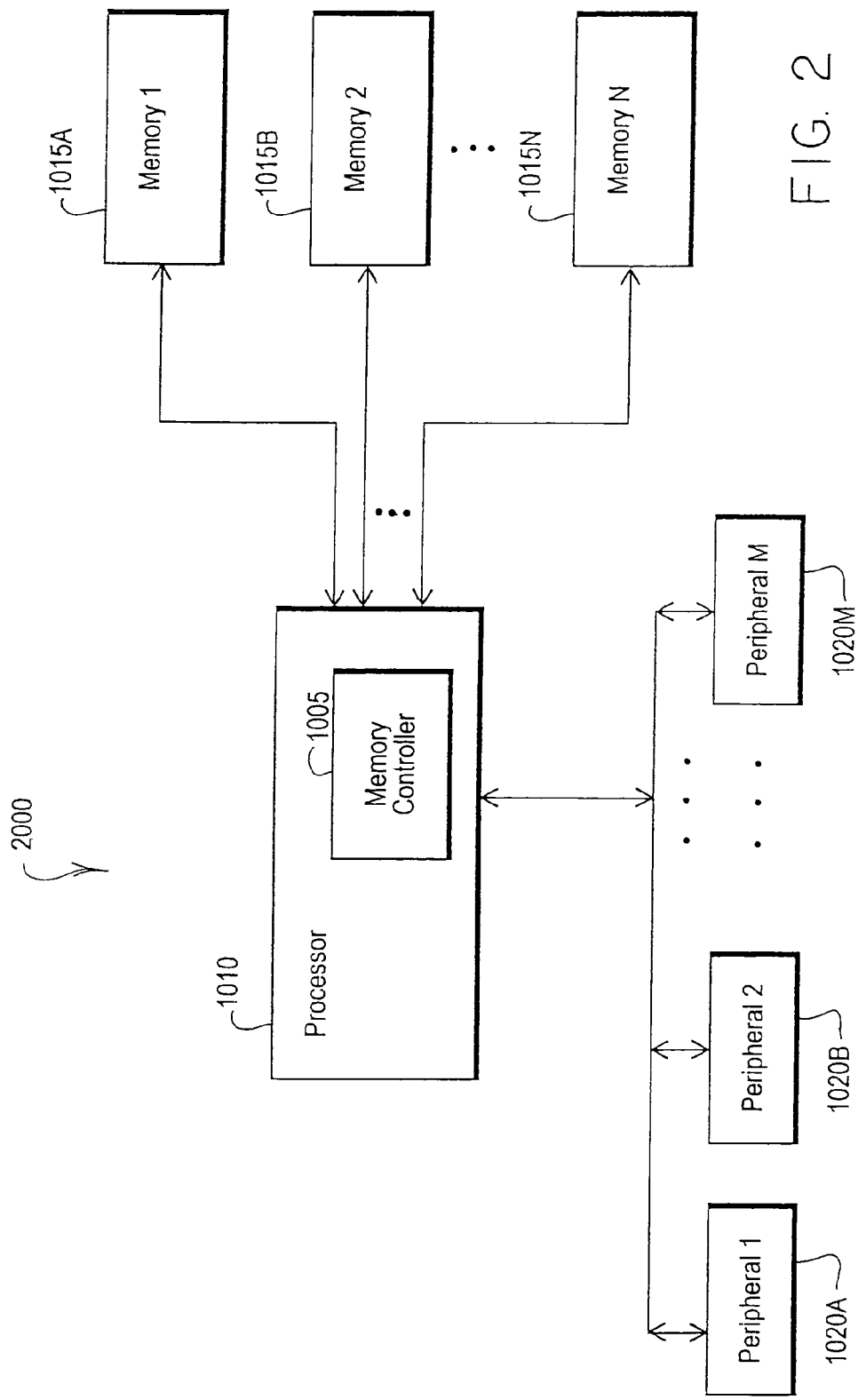
FIG. 2 illustrates a conceptual block diagram of another data-processing system that includes a memory controller according to the invention.

FIG. 2 illustrates a conceptual block diagram of another data-processing system 2000 that includes a memory controller 1005 according to the invention. The memory controller resides within a processor 1010. The processor 1010 receives, decodes, and executes program instructions. The program instructions may operate on data within the system 2000 and/or external data. Depending on its specifications and particular implementation, the system 2000 may have more than one processor 1010 and/or more than one memory controller 1005, as desired. Furthermore, several processors 1010 may share a memory controller 1005, or vice versa, depending on the application and desired performance, as persons of ordinary skill in the art would understand.

One or more memories 1015A-1015N store program instructions and data. Generally, the memories 1015A-1015N may include a wide variety of memories, such as read-only memories (ROM), random-access memories (RAM), static random-access memories (SRAM), dynamic random-access memories (DRAM), synchronous dynamic random-access memories (SDRAM), flash memories, programmable read-only memories (PROM), erasable programmable read-only memories (EPROM), electrically erasable read-only memories (EEROM), and electrically erasable programmable read-only memories (EEPROM). The memory controller 1005 couples to, and communicates with, the memories 1015A-1015N.

The system 2000 may optionally include one or more peripherals 1020A-1020M, as desired. The peripherals 1020A-1020M may include a variety of devices, for example, communication or telecommunication circuitry, video circuitry, audio circuitry, input circuitry, output circuitry, storage circuitry, and network circuitry. The system 2000 may also include one or more interface circuitries (not shown explicitly) that interface one or more of the peripherals 1020A-1020M to the processor circuitry 1010. Note that at least some of the peripherals 1020A-1020M and/or interface circuitries (not shown) may reside within the processor 1010, as desired.

Note that one may integrate one or more blocks of the system 2000 in one or more integrated circuits, as desired. For example, in exemplary embodiments of the invention, the processor 1010 and the memory controller 1005 reside within a single integrated circuit. The choice of integration and partitioning of the system 2000 depends on design criteria and specification, as persons skilled in the art would understand.

Figure 3:
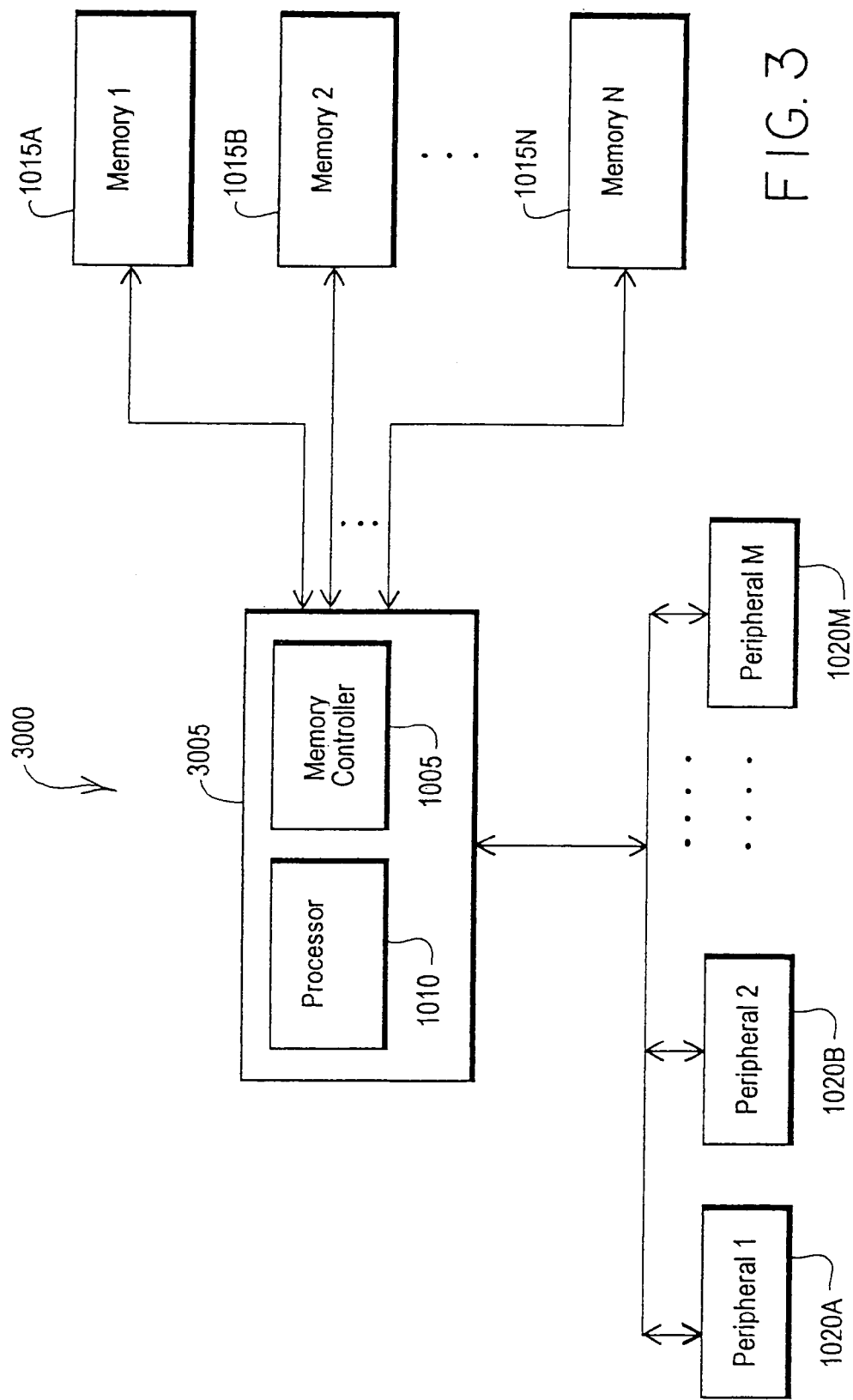
FIG. 3 depicts a conceptual block diagram of another system that includes a memory controller according to the invention.

FIG. 3 depicts a conceptual block diagram of another system 3000 that includes a memory controller 1005 according to the invention. The system 3000 also includes a processor 1010. The processor 1010 receives, decodes, and executes program instructions. The program instructions may operate on data within the system 3000 and/or external data. Depending on its specifications and particular implementation, the system 3000 may have more than one processor 1010 and/or more than one memory controller 1005, as desired. Furthermore, several processors 1010 may share a memory controller 1005, or vice-versa, depending on the application and desired performance, as persons of ordinary skill in the art would understand.

The system 3000 includes a data-processing block 3005. In the exemplary embodiment shown in FIG. 3, the processor 1010 and the memory controller 1005 reside within the data-processing block 3005. The data processing block 3005 may constitute an integrated circuit, a multi-chip module, or an electronic assembly, such as a printed-circuit assembly, that includes data-processing elements and circuitries. Functionally, the data-processing block 3005 may constitute a single processing element, such as a single-processor computer, or a node in a multi-processor system (not shown), or a node in a network of interconnected or distributed processors (not shown).

One or more memories 1015A-1015N store program instructions and data. Generally, the memories 1015A-1015N may include a wide variety of memories, such as read-only memories (ROM), random-access memories (RAM), static random-access memories (SRAM), dynamic random-access memories (DRAM), synchronous dynamic random-access memories (SDRAM), flash memories, programmable read-only memories (PROM), erasable programmable read-only memories (EPROM), electrically erasable read-only memories (EEROM), and electrically erasable programmable read-only memories (EEPROM). The memory controller 1005 couples to, and communicates with, the memories 1015A-1015N. The memory controller 1005 may also communicate with the processor 1010, either directly, or through interface circuitry (not shown).

The system 3000 may optionally include one or more peripherals 1020A-1020M, as desired. The peripherals 1020A-1020M may include a variety of devices, for example, communication or telecommunication circuitry, video circuitry, audio circuitry, input circuitry, output circuitry, storage circuitry, and network circuitry. The system 3000 may also include one or more interface circuitries (not shown explicitly) that interface one or more of the peripherals 1020A-1020M to the processor circuitry 1010. Note that at least some of the peripherals 1020A-1020M and/or interface circuitries (not shown) may reside within the processor 1010, as desired.

Figure 4:
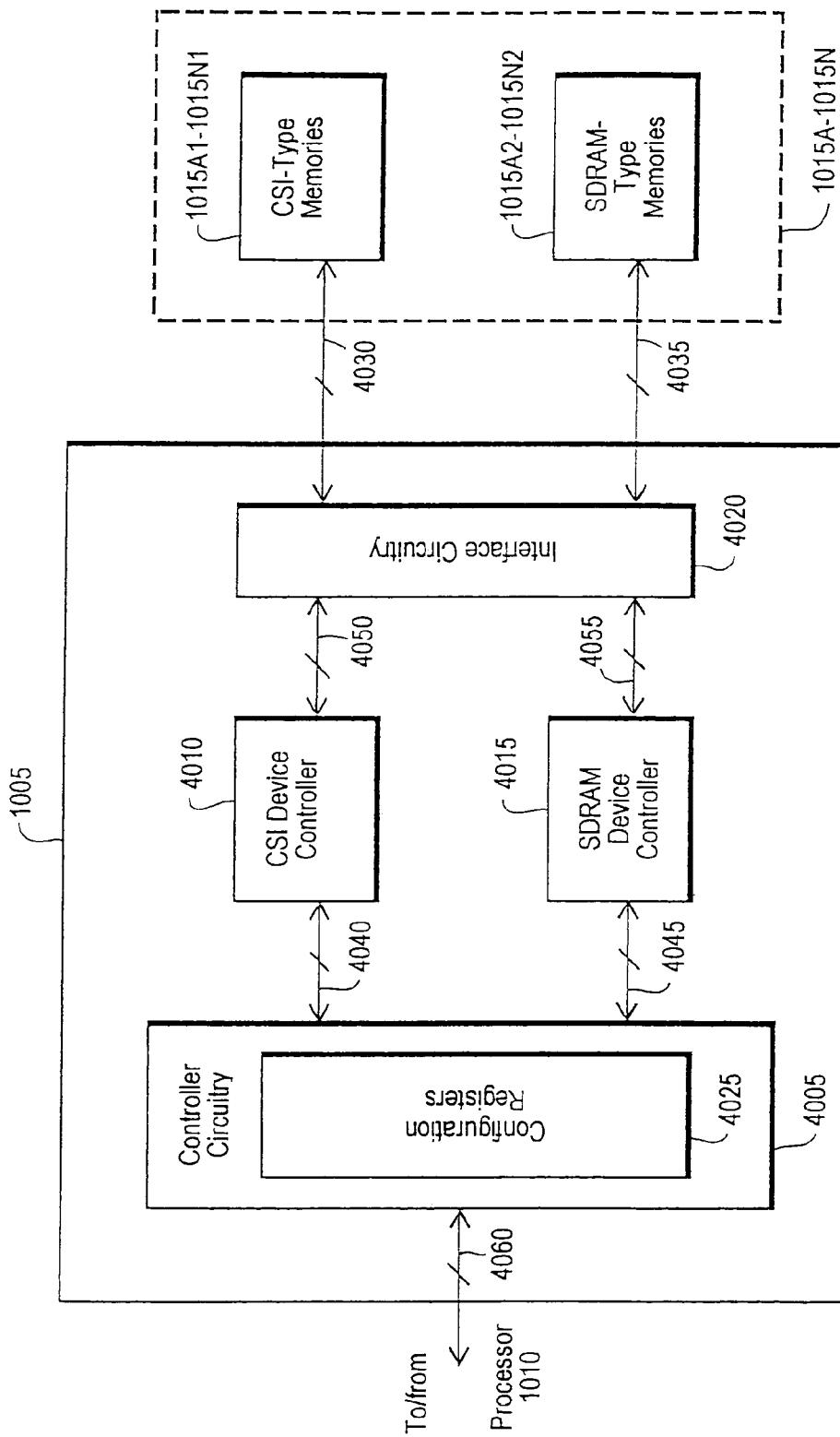
FIG. 4 shows a conceptual block diagram that shows more details of a memory controller according to one embodiment of the invention.

FIG. 4 shows a conceptual block diagram that shows more details of a memory controller 1005 according to one embodiment of the invention. The memory controller 1005 includes a controller circuitry 4005, a CSI device controller 4010, an SDRAM device controller 4015, and an interface circuitry 4020. The controller circuitry 4005 couples to another circuit (not shown explicitly), such as processor 1010, and performs memory transactions requested by that other circuit. The controller circuitry 4005 may communicate data and/or address and/or command and control signals with the other circuit via interface signals 4060, as desired.

The controller circuitry 4005 supervises and controls the overall operation of the memory controller 1005 and, more particularly, the operation of the various blocks of memory controller 1005, such as the CSI device controller 4010 and SDRAM device controller 4015. By coordinating the operations of the various blocks of memory controller 1005, controller circuitry 4005 ultimately causes performance of operations that result in executing the requested memory transactions.

The controller circuitry 4005 includes one or more configuration registers 4025. The user may program various operations of the memory controller 1005 by programming the configuration registers 4025. In exemplary embodiments, the configuration registers 4025 have various fields that control the functions of the CSI device controller 4010 and SDRAM device controller 4015.

The controller circuitry 4005 may also include status registers (not shown explicitly), as desired. The status registers may provide via interface signals 4060 information about various aspects of the operation of the memory controller 1005, such as progress of a requested transaction, failure of a transaction, or completion of a transaction, and the like, as desired. The user may also obtain information about the status of various blocks of the memory controller 1005 by reading or polling the status registers. Furthermore, the user may ascertain the progress of various memory transactions by polling or reading the status registers.

Note that one may modify the function and number of configuration registers 4025, as well as the function and number of various fields within the configuration registers 4025, depending on the design and performance specifications for the memory controller 1005 and/or the overall system, as desired. Furthermore, one may include the status registers within the configuration registers, or vice-versa, as desired (i.e., a register that has fields corresponding to the configuration functions as well as fields that pertain to providing status information). Such desired modifications fall within the knowledge of persons of ordinary skill in the art who have read the description of the invention.

The controller circuitry 4005 communicates with the CSI device controller 4010 via an interface 4040. The CSI device controller 4010 supervises and controls the transactions with CSI devices 1015A1-1015N1, which constitute a subset of memories 1015A-1015N. The CSI device controller 4010 supplies various control, address, and data signals to a selected CSI device 1015A1-1015N1 in a write transaction. In a read transaction, the CSI device controller 4010 provides various control and address signals to the CSI devices 1015A1-1015N1, and receives data signals from a selected CSI device 1015A1-1015N1.

The controller circuitry 4005 also communicates with the SDRAM device controller 4015 via an interface 4045. The SDRAM device controller 4015 supervises and controls the transactions with SDRAM devices 1015A2-1015N2, which constitute a subset of memories 1015A-1015N. The SDRAM device controller 4015 supplies various control, address, and data signals to a selected SDRAM device 1015A2-1015N2 in a write transaction. In a read transaction, the SDRAM device controller 4015 provides various control and address signals to the SDRAM devices 1015A2-1015N2, and receives data signals from a selected SDRAM device 1015A2-1015N2. In addition, the SDRAM device controller facilitates refresh operations of the SDRAM devices 1015A2-1015N2, as described below in detail.

The interface circuitry 4020 communicates with the CSI device controller 4010 via an interface 4050. Interface 4050 allows the interface circuitry 4020 to receive address, control, and data (depending on the transaction) signals from the CSI device controller 4010. In a read transaction, the interface circuitry provides data to the CSI device controller 4010 through interface 4050. Through an interface 4030, the interface circuitry 4020 communicates with CSI devices 1015A1-1015N1, as described below in detail.

The interface circuitry 4020 also communicates with the SDRAM device controller 4015 via an interface 4055. Interface 4055 allows the interface circuitry to receive address, control, and data (depending on the transaction) signals from the SDRAM device controller 4015. In a read transaction, the interface circuitry 4020 provides data to the SDRAM device controller 4015 through interface 4055. Also through interface 4055, the SDRAM device controller 4015 facilitates refresh operations of SDRAM devices 1015A2-1015N2. Through an interface 4035, the interface circuitry 4020 communicates with SDRAM devices 1015A2-1015N2, as described below in detail.

The memory controller 1005 and, more specifically, the SDRAM device controller 4015, periodically issues column-address-strobe (CAS) before row-address-strobe (RAS), or CAS before-RAS (CBR), refresh commands to SDRAM devices 1015A2-1015N2. The refresh commands cause the SDRAM devices 1015A2-1015N2 to perform refresh operations that prevent degradation of data stored in SDRAM devices 1015A2-1015N2. The SDRAM device controller 4015 issues one refresh command to each row of the SDRAM devices 1015A2-1015N2 within a refresh period.

Exemplary embodiments of the invention use a programmable count-down timer or counter to implement the refresh operation. Programming the count-down timer with an appropriate refresh interval between refresh commands ensures that every row within SDRAM devices 1015A2-1015N2 refreshes within the overall refresh period. The timer counts down from an initial value that corresponds to the refresh interval. When the count reaches zero, a refresh command issues via the interface circuitry 4020. The timer loads with a value corresponding to the refresh interval, and the process repeats. The refresh command uses various control signals, described below in detail.

In exemplary embodiments, the memory controller 1005 has paging capability. The paging capability can improve data throughput in memory transactions and, thus, enhance overall system performance. Paging provides a performance enhancement by allowing an SDRAM transaction to commence without first activating a row, assuming that a previous transfer has already done so. A page denotes a combination of a row address, bank address (described below), and chip-enable (described below) signals. An open page refers to a page that has already received a row-activate command that the memory controller has not yet closed via a precharge command. Memory controllers in exemplary embodiments of the invention open pages initially in numerical order.

In one embodiment of a memory controller according to the invention, the memory controller 1005 supports up to four open pages, although one may support other numbers of open pages by making modifications within the knowledge of persons skilled in the art who have read the description of the invention. To properly perform a refresh command, the memory controller 1005 first closes any open pages via precharge commands to SDRAM devices 1015A2-1015N2. Alternatively, one may use a broadcast precharge command to close any open pages in SDRAM devices 1015A2-1015N2, as desired.

Typical SDRAM devices 1015A2-1015N2 use a bit of the address bus (usually address bit 10) that couples the memory controller 1005 to SDRAM devices 1015A2-1015N2. That bit of the address bus acts as a precharge select bit. In conventional memory controllers, the CSI devices and the SDRAM devices share an address bus, which may result in conflict between the CSI controller and the SDRAM controller, as noted above. By using a dedicated SDRAM address/control signal and an associated signal line or pin, while sharing some address signals, memory controllers according to the invention overcome the conflicts between CSI and SDRAM controllers present in conventional memory controllers.

Figure 5:
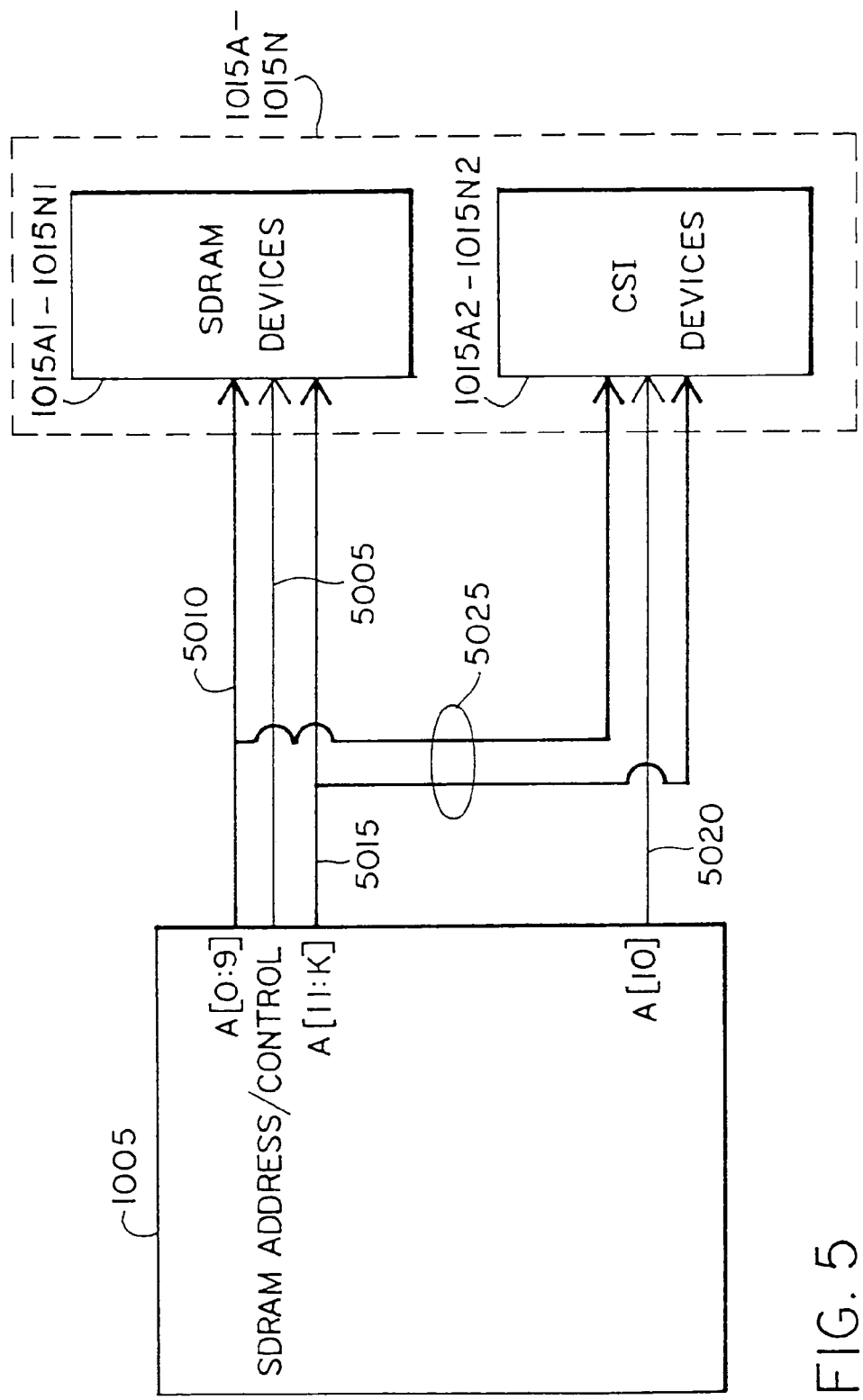
FIG. 5 shows a conceptual block diagram according to an embodiment of the invention that illustrates the sharing of some address signals between CSI-type and SDRAM-type of memories.

FIG. 5 shows a conceptual block diagram according to an embodiment of the invention that illustrates the sharing of some address signals between CSI devices 1015A1-1015N1 and SDRAM devices 1015A2-1015N2. FIG. 5 also illustrates a dedicated SDRAM address/control signal 5005. The circuit arrangement in FIG. 5 includes the memory controller 1005, CSI devices 1015A1-1015N1, and SDRAM devices 1015A2-1015N2. The memory controller 1005 couples to the CSI devices 1015A1-1015N1 and SDRAM devices 1015A2-1015N2 via an address bus that includes address signals 5025.

The memory controller 1005 in the circuit arrangement in FIG. 5 provides an address bus that includes bits 0 through K. In other words, the address bus constitutes a (K+1)-bit-wide address bus. For example, a 22-bit address bus (i.e., K=21) in one embodiment of the invention has bits 0-21, which correspond to a 4-giga-word address space. CSI devices 1015A1-1015N1 and SDRAM devices 1015A2-1015N2 share bits 0 through 9 (labeled with numeral 5010) and bits 11 through K (labeled with numeral 5015) of the address bus. In other words, the memory controller 1005 provides bits 0-9 and 11-K of the address bus (labeled collectively by numeral 5025) to CSI devices 1015A1-1015N1 and SDRAM devices 1015A2-1015N2.

Memory controller 1005 provides bit 10 (labeled with numeral 5020) of the address bus to the CSI devices 1015A1-1015N1. Thus, CSI devices 1015A1-1015N1 use all bits of the address bus (i.e., bits 0 through K) to perform various memory transactions, such as read and write transactions. Put another way, CSI devices 1015A1-1015N1 may use the address bus, including bit 10, to perform requested memory transactions.

Memory controllers in exemplary embodiments of the invention use the dedicated SDRAM address/control signal 5005 in two ways. During memory transactions with SDRAM devices 1015A2-1015N2, such as activate, read, and write transactions, memory controller 1005 uses the address/control signal 1005 as bit 10 of the address bus. Thus, together with bits 0-9 and 11-K of the address bus, the address/control signal provides a complete K-bit set of address signals to the SDRAM devices 1015A2-1015N2. Consequently, SDRAM devices 1015A2-1015N2 may use address bits 0-9, the address/control signal 5005, and address bits 11-K to perform requested memory transactions.

The address/control signal also serves as a control signal that facilitates refresh operations of the SDRAM devices 1015A2-1015N2. As noted above, memory controller 1005 supports paging and uses a precharge command or commands to close open pages in preparation for issuing a refresh command to SDRAM devices 1015A2-1015N2. Exemplary embodiments of memory controller 1005 according to the invention use the address/control signal 5005 as a precharge select control bit in precharge commands or in a broadcast precharge command to the SDRAM devices 1015A2-1015N2.

The SDRAM address/control signal 5005 constitutes a signal dedicated to facilitating the operation of SDRAM devices 1015A2-1015N2. As a result, the memory controller 1005 may issue precharge and refresh commands to SDRAM devices 1015A2-1015N2 even as the memory controller 1005 performs a transaction (e.g., read or write) with CSI devices that uses the address bus, including bit 10 of the address bus (labeled with numeral 5020). By using the dedicated SDRAM address/signal 5005, memory controllers according to the invention avoid stalling or delaying the refresh operations of the SDRAM devices 1015A2-1015N2 during transactions with the relatively slow CSI devices 1015A1-1015N1. Preventing conflicts between SDRAM devices 1015A2-1015N2 and CSI devices 1015A1-1015N1 tends to reduce the complexity of the memory controller 1005 and also tends to ensure the reliability of the data stored in SDRAM devices 1015A2-1015N2.

Figure 6:
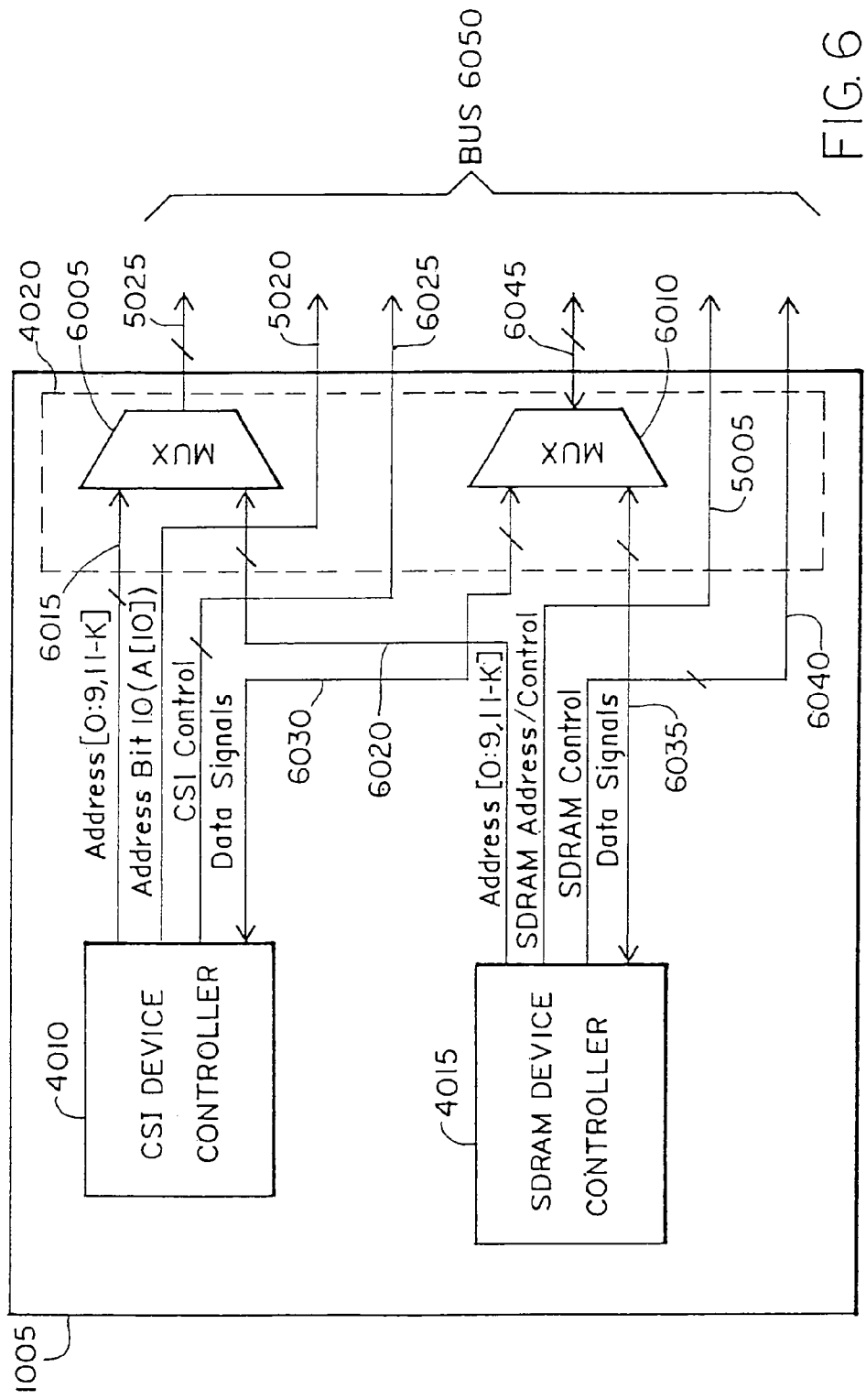
FIG. 6 shows a conceptual block diagram that provides more details of an exemplary embodiment according to the invention of a memory controller and associated interface signals for communicating with CSI and SDRAM types of memories.

FIG. 6 shows a conceptual block diagram that provides more details of an exemplary embodiment according to the invention of memory controller 1005, and associated interface signals, for communicating with CSI devices 1015A1-1015N1 and SDRAM devices 1015A2-1015N2. The interface circuitry 4020 includes address multiplexer 6005 and data multiplexer 6010. Address multiplexer 6005 receives CSI address signals 6015 (including CSI address bits 0-9 and 11-K) from the CSI device controller 4010 and SDRAM address signals 6020 (including SDRAM address bits 0-9 and 11-K) from the SDRAM device controller 4015. Depending on the state of an address multiplexer control signal (not shown explicitly) from the controller circuitry 4005 (see FIG. 4), the address multiplexer 6005 provides either the CSI address signals 6015 or the SDRAM address signals 6020 as the address signals 5025 to CSI devices 1015A1-1015N1 and SDRAM devices 1015A2-1015N2 via bus 6050.

Similarly, data multiplexer 6010 communicates with the CSI device controller 4010 via CSI data signals 6030. Data multiplexer 6010 also communicates with the SDRAM device controller 4015 via SDRAM data signals 6035. During write transactions, depending on the state of a data multiplexer control signal (not shown explicitly) from the controller circuitry 4005 (see FIG. 4), the data multiplexer 6010 provides either the CSI data signals 6030 or the SDRAM data signals 6035 as the data signals 6045 to CSI devices 1015A1-1015N1 and SDRAM devices 1015A2-1015N2 via bus 6050. During read transactions, depending on the state of the data multiplexer control signal (not shown explicitly), the data multiplexer 6010 receives the data signals 6045 from CSI devices 1015A1-1015N1 or SDRAM devices 1015A2-1015N2 via bus 6050, and provides the data signals 6045, respectively, to either the CSI device controller 4010 or the SDRAM device controller 4015.

The CSI device controller 4010 provides the address bit 10 signal 5020 to CSI devices 1015A1-115N1 via bus 6050. The CSI device controller 4010 also communicates a plurality of CSI control signals 6025 to CSI devices 1015A1-115N1 via bus 6050. Similarly, the SDRAM device controller 4015 provides the address/control signal 5005 to SDRAM devices 1015A2-1015N2 via bus 6050. Furthermore, the SDRAM device controller 4015 also communicates a plurality of SDRAM control signals 6040 (other than the address/control signal 5005) to SDRAM devices 1015A2-1015N2 via bus 6050.

Figure 7:
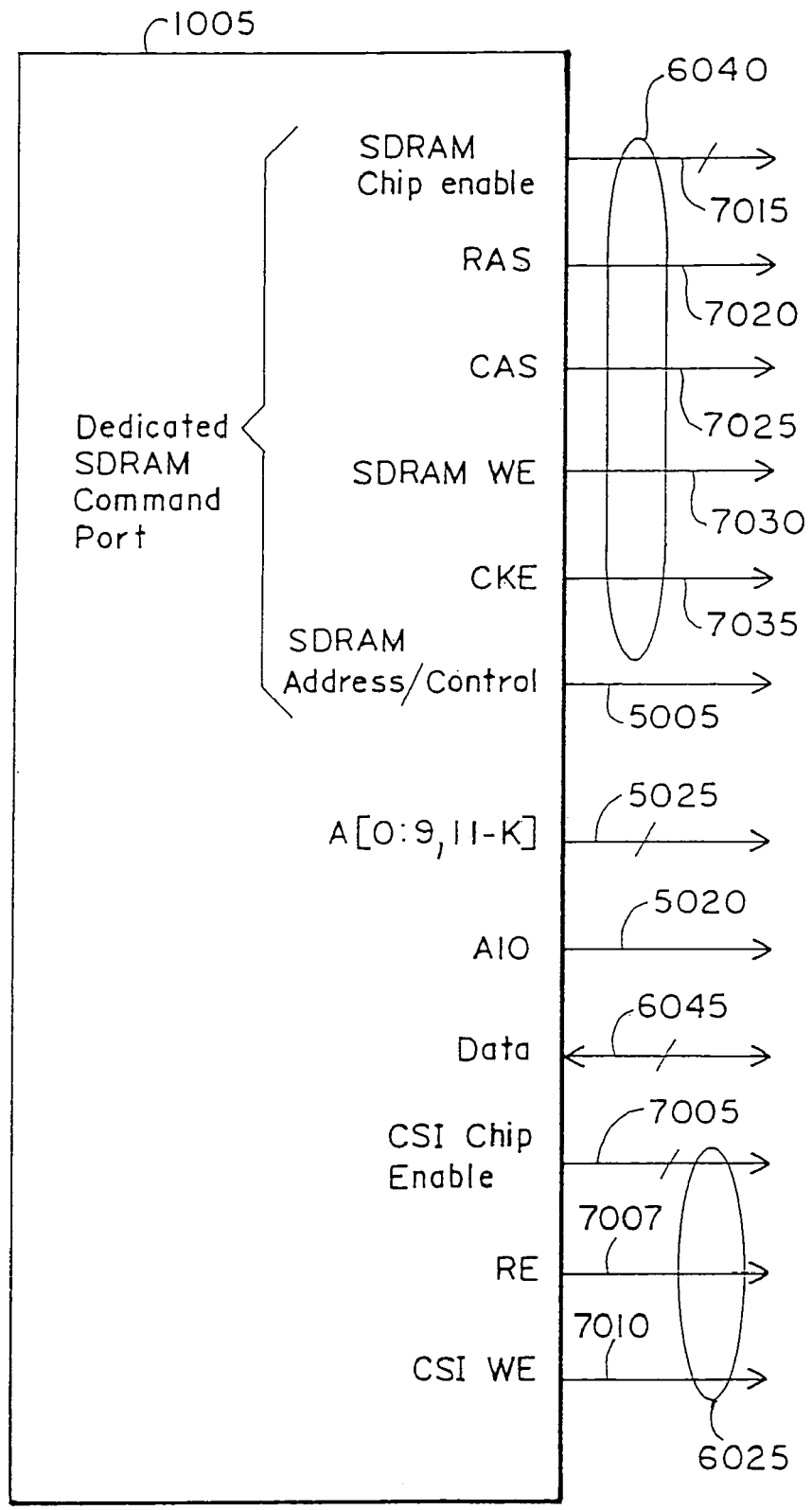
FIG. 7 illustrates more details of the various address, data, and control signals on a bus in one embodiment of the invention, where the bus can communicate with CSI and SDRAM types of memories.

FIG. 7 illustrates more details of the various address, data, and control signals within bus 6050 in one embodiment of the invention. The CSI control signals 6025 include CSI chip-enable (or chip-select) signals 7005, read-enable signal 7007 and, optionally, write-enable signal 7010. CSI chip-enable signals 7005 signify with which of the CSI devices 1015A1-1015N1 the memory controller 1005 wishes to conduct a memory transaction. The read-enable signal 7007 signifies that the memory controller 1005 seeks to perform a read transaction with a selected one of CSI devices 1015A1-1015N1.

If one or more of the CSI devices 1015A1-1015N1 support write transactions, the memory controller 1005 and bus 6050 may include the CSI write-enable signal 7010, as desired. The CSI write-enable signal 7010 signifies that the memory controller 1005 seeks to perform a write transaction with a selected one of CSI devices 1015A1-1015N1. If, however, the CSI devices 1015A1-1015N1 constitute read-only devices (such as ROM devices), then one may omit the CSI write-enable signal 7010, as desired.

Memory controller 1005 provides address signals 5025, which correspond to shared address bits 0 through 9 and 11 through K of the address bus, to the CSI devices 1015A1-1015N1. Furthermore, memory controller 1005 provides bit-10 signal 5020 of the address bus to the CSI devices 1015A1-1015N1. Thus, CSI devices 1015A1-1015N1 use all bits of the address bus (i.e., bits 0 through K) to perform various memory transactions, such as read and write transactions.

Memory controller 1005 also provides address signals 5025 to the SDRAM devices 1015A2-1015N2. Furthermore, memory controller 1005 provides the SDRAM address/control signal 5005 to the SDRAM devices 1015A2-1015N2. As described above, during memory transactions (e.g., activate, read, or write transactions), the SDRAM address/control signal 5005 serves as address bit 10 of the address bus. Thus, SDRAM devices 1015A2-1015N2 use address signals 5025 (i.e., bits 0 through 9 and 11 through K) together with the SDRAM address/control signal 5005 to perform various memory transactions.

The SDRAM control signals 6040 include SDRAM chip-enable signals 7015, RAS signal 7020, CAS signal 7025, SDRAM write-enable (WE) signal 7030, and SDRAM address/control signal 5005 (in its role as a signal that facilitates refresh operations of SDRAM devices 1015A2-1015N2, rather than its role as address bit 10 for memory transactions with SDRAM devices 1015A2-1015N2). The SDRAM control signals 6040 may also include a clock-enable (CKE) signal 7035, as desired. The clock-enable (CKE) signal 7035 serves the same function as it does in conventional memory controllers, as persons of ordinary skill in the art would understand.

SDRAM chip-enable signals 7005 signify with which of the SDRAM devices 1015A2-1015N2 the memory controller 1005 wishes to communicate. The RAS signal 7020, CAS signal 7025, and write-enable signal 7030 form a command word issued to SDRAM devices in order to control their various operations, as persons of ordinary skill in the art understand. In one role, the SDRAM write-enable signal 7030 signifies that the memory controller 1005 seeks to perform a write (or read, depending on the state or logical value of the SDRAM write-enable signal 7030) transaction with a selected one of SDRAM devices 1015A2-1015N2.

The SDRAM control signals 6040 also includes one or more bank selection (BA) signals (not shown explicitly), as desired. The bank selection signal or signals allow the system designer to address the system SDRAM as a plurality of memory banks. Memory banks provide flexibility and/or performance enhancements in certain system designs, as persons of ordinary skill in the art would understand.

As noted above, the address/control signal 5005 also serves as a control signal during refresh operations of the SDRAM devices 1015A2-1015N2. Also as noted above, because it supports paging, the memory controller 1005 uses a precharge command to close open pages in preparation for issuing a refresh command. The memory controller 1005 uses the address/control signal 5005 to provide a precharge command or precharge commands to the SDRAM devices 1015A2-1015N2. As a result, the memory controller 1005 may issue precharge and refresh commands to SDRAM devices 1015A2-1015N2 even as the memory controller 1005 performs a transaction (e.g., read or write) with CSI devices that uses the address bus, including bit 10 signal 5020 of the address bus.

The address/control signal 5005 constitutes a signal dedicated to facilitating the operation of SDRAM devices 1015A2-1015N2. Thus, the SDRAM address/control signal 5005, together with the SDRAM control signals 6040, forms a dedicated command port for the memory controller 1005. Using the dedicated command port, the memory controller can control various functions of the SDRAM devices 1015A2-1015N2. By using the dedicated command port, including the dedicated SDRAM address/signal 5005, memory controllers according to the invention avoid stalling or delaying the refresh operations of the SDRAM devices 1015A2-1015N2 during transactions with relatively slow CSI devices 1015A1-1015N1.

Depending on the type of memory transaction, memory controller 1005 either receives data from, or provides data to, CSI devices 1015A1-1015N1 or SDRAM devices 1015A2-1015N2. In a read transaction, the memory controller receives data from a selected (via the respective chip-enable signal) one of CSI devices 1015A1-1015N1 and SDRAM devices 1015A2-1015N2. Conversely, during a write transaction, the memory controller provides data to a selected (via the respective chip-enable signal) one of CSI devices 1015A1-1015N1 and SDRAM devices 1015A2-1015N2.

Note that, although the description of the various embodiments of the invention refers generically to SDRAM devices 1015A2-1015N2, the SDRAM devices 1015A2-1015N2 may include a variety of SDRAM devices. For example, the SDRAM devices 1015A2-1015N2 may include double-data-rate SDRAM devices, as desired.

Referring to the various interfaces in the drawings (for example, interfaces 4040, 4045, 4050, 4055, 4030, and 4035; bus 6050; etc.), one may include more or fewer types and/or numbers of signals than described in connection with exemplary embodiments of the invention. For example, depending on the particular type or model of memory used, the control signals may include signals whose name and/function differs from those described here. Because of the flexibility of the inventive concepts described, one may readily modify the circuitry and the associated interfaces to accommodate a variety of memory types and/or models. The modifications fall within the knowledge of a person of ordinary skill who has read the description of the invention.

Referring to the drawings, the various blocks shown depict mainly the conceptual functions and signal flow. The actual circuit implementation may or may not contain separately identifiable hardware for the various functional blocks. For example, one may combine the functionality of various blocks into one circuit block, as desired. Furthermore, one may realize the functionality of a single block in several circuit blocks, as desired. The choice of circuit implementation depends on various factors, such as particular design and specifications for a given implementation, as persons of ordinary skill in the art who have read the disclosure of the invention would understand.

As noted above, the address/control signal 5005 serves as SDRAM address bit 10 during memory transactions with the SDRAM devices 1015A2-1015N2. Rather than using the address/control signal 5005 as address bit 10, however, one may use it to represent other address bits, as desired. The choice of a particular address bit depends, among other things, on the standards and particular memory interface specifications in an implementation.

Furthermore, rather than using a one-bit address/control signal 5005, one may use multi-bit address/control signals. Thus, the address/control signal or signals may serve as dedicated control signals for controlling SDRAM devices 1015A2-1015N2, as desired. The choice of the number of address/control signals and their specific functionality depends on the design and performance specifications for a particular implementation, as persons skilled in the art who have read the description of the invention would understand.

The description of the address bus above refers to a 22-bit bus as an example. Note that one may apply the inventive concepts described here to buses having various widths, such as 16, 32, 64, etc., as desired. The width of the bus in a given implementation depends on the size of the desired address space, cost, silicon chip-area, and similar considerations that vary from one implementation to another.

Furthermore, in exemplary embodiments of the invention, the SDRAM chip-enable signals 7015, RAS signal 7020, CAS signal 7025, and SDRAM write-enable (WE) signal 7030 constitute active-low signals, whereas the clock-enable (CKE) signal 7035 is an active-high signal. One, however, may readily modify those embodiments of the invention to accommodate various combination of active-low and active-high signals, as persons skilled in the art who have read the description of the invention would understand. The choice of active-low or active-high signals depends on the type and/or model of memory circuits used in a particular embodiment of the invention.

Further modifications and alternative embodiments of this invention will be apparent to persons skilled in the art in view of this description of the invention. Accordingly, this description teaches those skilled in the art the manner of carrying out the invention and are to be construed as illustrative only.

The forms of the invention shown and described should be taken as the presently preferred embodiments. Persons skilled in the art may make various changes in the shape, size and arrangement of parts without departing from the scope of the invention described in this document. For example, persons skilled in the art may substitute equivalent elements for the elements illustrated and described here. Moreover, persons skilled in the art who have the benefit of this description of the invention may use certain features of the invention independently of the use of other features, without departing from the scope of the invention.

What is claimed is:

1. A circuit comprising:
   a port for coupling the circuit to a synchronous dynamic random access memory (SDRAM) and to a chip-select-interface device, the port comprising:
      a plurality of terminals for coupling to the SDRAM and to the chip-select-interface device;
      a first terminal for coupling to the SDRAM, the first terminal being for supplying an address signal to the SDRAM during memory transactions with the SDRAM, the first terminal being for supplying a refresh control signal to the SDRAM during a refresh operation of the SDRAM; and
      a second terminal for coupling to the chip-select-interface device, the second terminal being for supplying an address signal to the chip-select-interface device during the refresh operation, wherein the plurality of terminals and the second terminal together supply at least part of an address to the chip-select-interface device during the refresh operation,
   wherein during the refresh operation an address signal A[10] is supplied from the second terminal to the chip-select-interface device concurrently with the refresh control signal being supplied from the first terminal to the SDRAM.

2. The circuit of claim 1, wherein the plurality of terminals are for supplying a first set of address signals A[0:9] to the chip-select-interface device during the refresh operation, wherein the plurality of terminals are for supplying the first set of address signals A[0:9] to the SDRAM during said memory transactions with the SDRAM, and wherein the address signal supplied from the second terminal during the refresh operation is an address signal A[10].

3. The circuit of claim 1, wherein the SDRAM is a double-data-rate SDRAM.

4. The circuit of claim 1, wherein the first terminal receives a first address signal from an SDRAM-interface controller, and wherein the second terminal receives a second address signal from a chip-select-interface controller.

5. The circuit of claim 4, further comprising:
   a multiplexer that receives a first set of address signals from the chip-select-interface controller and a second set of address signals from the SDRAM-interface controller, wherein the multiplexer selectively provides either the first set of address signals or the second set of address signals to the plurality of terminals.

6. A circuit comprising:
   a port for coupling the circuit to a synchronous dynamic random access memory (SDRAM) and to a chip-select-interface device, the port comprising:
      a plurality of terminals for coupling to the SDRAM and to the chip-select-interface device;
      a first terminal for coupling to the SDRAM, the first terminal being for supplying an address signal to the SDRAM during memory transactions with the SDRAM, the first terminal being for supplying a refresh control signal to the SDRAM during a refresh operation of the SDRAM; and
      a second terminal for coupling to the chip-select-interface device, the second terminal being for supplying an address signal to the chip-select-interface device during the refresh operation, wherein the plurality of terminals and the second terminal together supply at least part of an address to the chip-select-interface device during the refresh operation,
   wherein the refresh control signal is taken from the group consisting of a row-address-strobe (RAS) refresh command, a column-address-strobe (CAS) refresh command, a CAS-before-RAS (CBR) refresh command, a precharge command and a broadcast precharge command.

7. The circuit of claim 1, wherein each of the circuit and the SDRAM is on a separate integrated circuit.

8. A data-processing system comprising:
   a synchronous dynamic random-access memory (SDRAM), the SDRAM configured to store and retrieve data;
   a chip-select-interface (CSI) memory, the CSI memory configured to store and retrieve data;
   an N-bit address bus, wherein the data is written to and read from the SDRAM and the CSI memory over the N-bit address bus; and
   means for writing the data to and reading the data from the CSI memory over all N bits of the N-bit address bus and for simultaneously performing a refresh operation on the SDRAM, wherein the refresh operation is taken from the group consisting of a row-address-strobe (RAS) refresh operation, a column-address-strobe (CAS) refresh operation, and a CAS-before-RAS (CBR) refresh operation.

9. The data-processing system of claim 8, wherein the means comprises a dedicated command port on a memory controller.

10. The data-processing system of claim 8, wherein the means comprises interface circuitry, wherein the interface circuitry is coupled both to the SDRAM and to the CSI memory.

11. The data-processing system of claim 8, wherein the SDRAM and the CSI memory share the N-bit address bus for all but a single address bit, wherein the means includes a dedicated SDRAM address/control signal line coupled to the SDRAM, and wherein during memory operations the single address bit is communicated to the SDRAM via the SDRAM address/control signal line.

12. The data-processing system of claim 11, wherein during refresh operations the SDRAM receives a control signal via the SDRAM address/control signal line, and wherein the control signal is taken from the group consisting of: a row-address-strobe (RAS) refresh command, a column-address-strobe (CAS) refresh command, a CAS-before-RAS (CBR) refresh command, a precharge command, a broadcast precharge command, an SDRAM write-enable (WE) signal, and a clock-enable (CKE) signal.

13. The data-processing system of claim 11, wherein during refresh operations the SDRAM receives a refresh command via the SDRAM address/control signal line concurrently with the CSI memory receiving the single address bit via the N-bit address bus.

14. The data-processing system of claim 11, wherein the SDRAM receives a precharge select control signal via the SDRAM address/control signal line.

\* \* \* \* \*